(12) United States Patent
Yoshino et al.

(10) Patent No.: US 9,041,156 B2
(45) Date of Patent: May 26, 2015

(54) SEMICONDUCTOR REFERENCE VOLTAGE GENERATING DEVICE

(75) Inventors: Hideo Yoshino, Chiba (JP); Hirofumi Harada, Chiba (JP); Jun Osanai, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 982 days.

(21) Appl. No.: 12/584,638

(22) Filed: Sep. 9, 2009

(65) Prior Publication Data

US 2010/0059832 A1   Mar. 11, 2010

(30) Foreign Application Priority Data

Sep. 10, 2008  (JP) ................................. 2008-231976

(51) Int. Cl.
*H01L 29/78* (2006.01)
*G05F 3/02* (2006.01)
*H01L 27/088* (2006.01)
*G05F 3/24* (2006.01)

(52) U.S. Cl.
CPC .............. *H01L 27/0883* (2013.01); *G05F 3/24* (2013.01)

(58) Field of Classification Search
CPC ... H01L 27/105; H01L 27/0711; G11C 5/147
USPC .......... 257/551, E27.631, 408; 323/281, 313; 327/538, 541
See application file for complete search history.

(56) References Cited

U.S. PATENT DOCUMENTS

| 4,100,437 | A | * | 7/1978 | Hoff, Jr. ......................... 327/543 |
| 4,417,263 | A | * | 11/1983 | Matsuura ....................... 257/392 |
| 5,280,455 | A | * | 1/1994 | Kanaishi ........................ 365/229 |
| 5,376,839 | A | * | 12/1994 | Horiguchi et al. ............. 327/541 |
| 5,434,533 | A | | 7/1995 | Furutani ....................... 327/538 |
| 5,821,808 | A | * | 10/1998 | Fujima .......................... 327/541 |
| 6,628,161 | B2 | * | 9/2003 | Ikeda ............................. 327/538 |
| 7,349,190 | B1 | * | 3/2008 | Maheedhar et al. ............ 361/92 |
| 2002/0163385 | A1 | * | 11/2002 | Ikeda ............................ 330/261 |
| 2004/0004876 | A1 | * | 1/2004 | Choi et al. ..................... 365/202 |
| 2006/0132114 | A1 | * | 6/2006 | Giduturi et al. ............... 323/313 |
| 2008/0285339 | A1 | * | 11/2008 | Barkley ...................... 365/185.2 |

FOREIGN PATENT DOCUMENTS

JP       2001-177065       *    6/2001

OTHER PUBLICATIONS

Patent Abstracts of Japan, publication No. 05-289760, publication date Nov. 5, 1993.
Patent Abstracts of Japan, publication No. 11-134051, publication date May 21, 1999.

* cited by examiner

*Primary Examiner* — Jerome Jackson, Jr.
*Assistant Examiner* — Paul Budd
(74) *Attorney, Agent, or Firm* — Adams & Wilks

(57) ABSTRACT

A reference voltage generating circuit has more than two first wells each having a first impurity concentration and more than two second wells each having a second impurity concentration different from the first impurity concentration. A first group of MOS transistors has more than two MOS transistors formed in respective ones of the first wells. A second group of MOS transistors has More than two MOS transistors formed in respective ones of the second wells.

6 Claims, 6 Drawing Sheets

SEMICONDUCTOR REFERENCE VOLTAGE GENERATING DEVICE

BACKGROUND OF THE INVENTION

1. Field of the Invention

The present invention relates to a semiconductor device in which a depletion type metal-oxide-semiconductor (MOS) transistor and an enhancement type MOS transistor are employed.

2. Description of the Related Art

In recent years, along with progress in technology for reducing a chip size of an integrated circuit (IC), leveling of the technology has been advanced. One way to maintain advantage in the current technology progress is to create a high-value-added product having superior characteristics.

The above-mentioned characteristics may be of various types, and include a temperature characteristic and sensitivity. First, the temperature characteristic of the IC is described as an example. In order to improve the temperature characteristic of the IC, the stability of a reference voltage, which exists in the IC, to temperature is mainly required.

For a reference voltage generating circuit, various types of circuits have been considered in accordance with a manufacturing process or layout in the IC. One of the most generally employed circuits with convenience may be a combination of a depletion type MOS transistor and an enhancement type MOS transistor.

With regard to the reference voltage circuit in which the depletion type MOS transistor and the enhancement type MOS transistor are employed, a number of ideas for improving the temperature characteristic through an inventive approach to the circuit have been described in documents (see, for example, JP 05-289760 A and JP 11-134051 A).

Next, in terms of the sensitivity, in a case of a voltage regulator, an output voltage should be stable against an input voltage. In this case, a reference voltage or other analog circuit characteristics are required to be stable and not to change depending on the input voltage. Also in this case, through the inventive approach to the circuit, suppression of the fluctuations of the reference voltage and the like are generally attempted.

However, in the above-mentioned methods the inventive approach to the circuit itself makes a circuit structure complicated and increases an area of the IC. At present, costs of the IC are increasingly reduced, and downsizing of the IC is also an important matter. Accordingly, an increase in the area of the IC by the circuit provided for adding a value is not effective.

Further, in a case where a production of an existing product is shifted to another factory for manufacture, a significant load is imposed for redoing a circuit design or layout when the product shows different characteristics.

SUMMARY OF THE INVENTION

In view of the above, the present invention has an object to enhance a temperature characteristic or analog characteristic of an integrated circuit (IC) without increasing an area of the IC through an inventive approach not on a circuit but on a device.

In order to achieve the above-mentioned object, the present invention employs the following means.

(1) In a semiconductor device including an enhancement type metal-oxide-semiconductor (MOS) transistor and a depletion type MOS transistor, a concentration of a well of the enhancement type MOS transistor is different from a concentration of a well of the depletion type MOS transistor.

(2) In a semiconductor device including a reference voltage generating circuit including an enhancement type MOS transistor and a depletion type MOS transistor, a concentration of a well of the enhancement type MOS transistor is different from a concentration of a well of the depletion type MOS transistor.

(3) In the semiconductor devices according to Item (1) and Item (2) including the enhancement type MOS transistor and the depletion type MOS transistor, a part of the well of the depletion type MOS transistor is changed in concentration.

(4) In the semiconductor devices according to Item (1) and Item (2) including the enhancement type MOS transistor and the depletion type MOS transistor, a part of the well of the enhancement type MOS transistor is changed in concentration.

(5) In the semiconductor devices according to Item (1,) and Item (2) including the enhancement type MOS transistor and the depletion type MOS transistor, a part of the well of the depletion type MOS transistor and a part of the well of the enhancement type MOS transistor are each changed in concentration.

(6) In the semiconductor devices according to Item (1) and Item (2) including the enhancement type MOS transistor and the depletion type MOS transistor, the depletion type MOS transistor includes a plurality of depletion type MOS transistors each having a different concentration in an entirety or a part of the well to select an optimum depletion type MOS transistor of the plurality of depletion type MOS transistors by, for example, trimming.

(7) In the semiconductor devices according to Item (1) and Item (2) including the enhancement type MOS transistor and the depletion type MOS transistor, the enhancement type MOS transistor includes a plurality of enhancement type MOS transistors each having a different concentration in an entirety or a part of the well to select an optimum enhancement type MOS transistor of the plurality of enhancement type MOS transistors by, for example, trimming.

(8) In the semiconductor devices according to Item (1) and Item (2) including the enhancement type MOS transistor and the depletion type MOS transistor, the depletion type MOS transistor includes a plurality of depletion type MOS transistors each having a different concentration in an entirety or a part of the well to select an optimum depletion type MOS transistor of the plurality of depletion type MOS transistors by, for example, trimming, and the enhancement type MOS transistor includes a plurality of enhancement type MOS transistors each having a different concentration in an entirety or a part of the well to select an optimum enhancement type MOS transistor of the plurality of enhancement type MOS transistors by, for example, trimming.

According to the present invention described above, the temperature characteristic or analog characteristic of the IC may be enhanced without increasing the area of the IC.

Further, for example, when an existing product is shifted to another factory for manufacture, if the product has a different temperature characteristic or different analog characteristic, the temperature characteristic or analog characteristic of the IC may be adjusted without redoing a circuit design or layout.

DETAILED DESCRIPTION OF THE PREFERRED EMBODIMENTS

A semiconductor device proposed in the present invention relates to a semiconductor device in which a depletion type metal-oxide-semiconductor (MOS) transistor and an enhancement type MOS transistor are employed, and in which concentrations of wells of the depletion type MOS transistor and the enhancement type MOS transistor are changed or varied to improve characteristics of a principal circuit, thereby enhancing characteristics of the semiconductor device.

Hereinafter, a principle and embodiments of the present invention are described.

Figure 1:
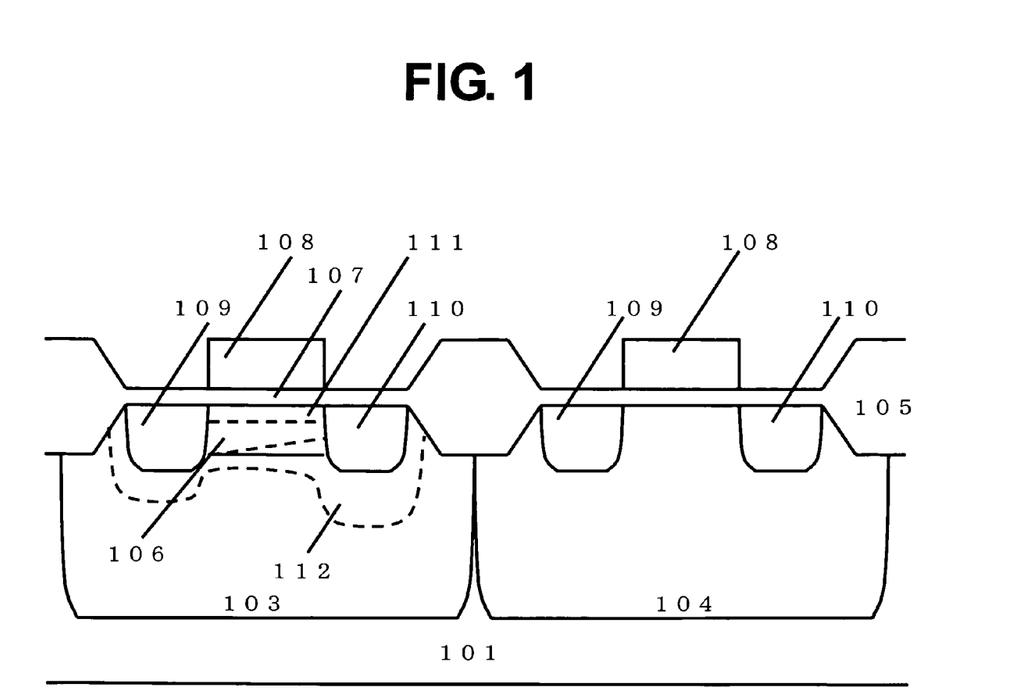
FIG. 1 is a cross sectional view illustrating a depletion type MOS transistor and an enhancement type MOS transistor, which are a principal part of the present invention.

FIG. 1 illustrates a cross sectional structure of the depletion type MOS transistor and the enhancement type MOS transistor according to the present invention. In FIG. 1, reference numeral 101 denotes a semiconductor silicon substrate, and a well region 103, which is a low concentration second conductivity type impurity region for the depletion type MOS transistor, and a well region 104, which has a concentration different from a concentration of the well region 103 for the depletion type MOS transistor and is a low concentration second conductivity type impurity region for the enhancement type MOS transistor, are formed in the silicon substrate 101. The depletion type MOS transistor and the enhancement type MOS transistor are formed in the well region 103 and the well region 104, respectively.

The depletion type MOS transistor and the enhancement type MOS transistor are electrically insulated from other components by a field insulating film 105, and gate electrodes 108 of the transistors are formed via a gate insulating film 107. A channel region 106, which is a low concentration first conductivity type impurity region, is formed below the gate electrode 108 of the depletion type MOS transistor, and is in contact with a high concentration first conductivity type source region 109 and a high concentration first conductivity type drain region 110.

A region 111 within a dotted line indicates a second depletion layer that is formed with the gate when a gate bias slightly higher than a threshold voltage of the depletion type MOS transistor is applied. A region 112 within a dotted line indicates a first depletion layer that is formed by a junction between the first conductivity type channel region 106, the first conductivity type source region 109, and the first conductivity type drain region 110, and the second conductivity type well region 103.

Next, the principle of the present invention is described with a reference voltage generating circuit being taken as an example of a principal circuit in which the depletion type MOS transistor and the enhancement type MOS transistor are employed. Here, the reference voltage generating circuit is described as a simplest enhancement-depletion (ED) type.

Figure 2:
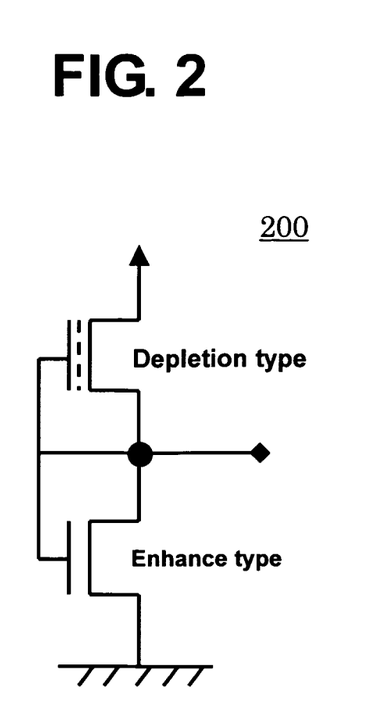
FIG. 2 is a diagram illustrating a reference voltage generating circuit of a simplest ED type, in which a depletion type MOS transistor and an enhancement type MOS transistor are employed.

FIG. 2 is a circuit diagram illustrating a general ED type reference voltage generating circuit 200. An operation principle of the ED type reference voltage generating circuit 200 is as follows.

First, a constant current independent of an input voltage is generated by a depletion type MOS transistor having a gate electrode and a source electrode connected to each other. Then, the generated constant current is caused to flow in an enhancement type MOS transistor that is connected in a saturated manner. As a result, a potential at a portion indicated by a black dot ● of FIG. 2 rises to finally reach a constant voltage independent of the input voltage.

Here, theoretical equations for a reference voltage are derived.

First, when a gate voltage, the threshold voltage, and a K value of the depletion type MOS transistor are represented by VGD, VTD, and KD, respectively, a constant current ID generated by the depletion type MOS transistor is expressed by the following Equation 1.

$$ID = KD(VGD-VTD)^2 \quad \text{[Equation 1]}$$

Here, the gate electrode of the depletion type MOS transistor is connected to the source electrode thereof, and VGD equals 0 V. Therefore, the following Equation 2 is obtained by substituting 0 V for VDG of Equation 1.

$$ID = KD(0-VTD)^2 = KD(VTD)^2 \quad \text{[Equation 2]}$$

Next, when a gate voltage, a threshold voltage, and a K value of the enhancement type MOS transistor are represented by VGE, VTE, and KE, respectively, a current IE flowing in the enhancement type MOS transistor is expressed by the following Equation 3.

$$IE = KE(VGE-VTE)^2 \quad \text{[Equation 3]}$$

Here, the same current flows in the depletion type MOS transistor and the enhancement type MOS transistor, and hence Equation 2 equals Equation 3. Then, the following Equation 4 is established.

$$ID = IE = KD(VTD)^2 = KE(VGE-VTE)^2 \quad \text{[Equation 4]}$$

The following Equation 5 is obtained by transforming Equation 4.

$$VGE = VTE + \frac{\sqrt{KD}}{\sqrt{KE}}|VTD| \quad \text{[Equation 5]}$$

Here, the enhancement type MOS transistor is connected in the saturated manner, and hence both the gate voltage and a drain voltage thereof become the reference voltage. Therefore, the reference voltage, which is represented by Vref, is expressed by the following Equation 6.

$$Vref = VTE + \frac{\sqrt{KD}}{\sqrt{KE}}|VTD| \qquad \text{[Equation 6]}$$

Accordingly, the reference voltage is formed of the threshold voltage VTE of the enhancement type MOS transistor, the threshold voltage VTD of the depletion type MOS transistor, and a ratio $(KD/KE)^{1/2}$ of the K value of the enhancement type MOS transistor and the K value of the depletion type MOS transistor.

Here, a temperature characteristic of the reference voltage is considered.

Based on the results shown above, the temperature characteristic of the reference voltage is similarly determined by the temperature characteristics of VTE, VTD, and $(KD/KE)^{1/2}$.

The threshold voltage VTE of the enhancement type MOS transistor corresponds to a gate voltage when carriers are induced in the channel region below the gate insulating film and a current starts to flow due to an inversion of the channel region. In a case where a temperature of a semiconductor changes, the number of minority carriers changes along with the change in thermal energy, which changes an effective concentration of the impurity atoms. The change in effective concentration with respect to the temperature is differently influenced depending on the level of concentration. Accordingly, when the concentration of the well is changed, a change amount of the effective concentration with respect to the temperature of the channel region changes, with the result that an change amount of the voltage which causes inversion in the channel region changes. In other words, the temperature characteristic of VTE changes.

The threshold voltage VTD of the depletion type MOS transistor corresponds to a gate voltage when a part of the first conductivity type channel region is choked by the first depletion layer that is formed by the pn junction between the first conductivity type channel region and the second conductivity type well region, and by the second depletion layer that is formed by the applied gate voltage on a substrate surface side, thereby cutting off an electrical connection.

Accordingly, the temperature change of the threshold voltage VTD of the depletion type MOS transistor is influenced by the temperature change of the first depletion layer that is formed by the pn junction between the first conductivity type channel region and the second conductivity type well region. In order to change the temperature characteristic of the depletion layer at the pn junction, a concentration difference between a p-type impurity concentration and an n-type impurity concentration may be changed. When the concentration of the well is changed, the temperature characteristic of the first depletion layer that is formed by the pn junction between the first conductivity type channel region and the second conductivity type well region changes. As a result, the change amount of the voltage for choking a part of the channel region by the first depletion layer and the second depletion layer changes. In other words, the temperature characteristic of VTD changes.

In this way, as described in the present invention, with regard to both the depletion type MOS transistor and the enhancement type MOS transistor, when the concentration of the well is changed, the temperature characteristic of the reference voltage generating circuit or the temperature characteristic of the principal circuit changes, and moreover, the temperature characteristic of the semiconductor device changes.

Next, dependence of the reference voltage or other analog circuit characteristics on the input voltage is considered.

When the input voltage is raised to increase an electric field between the source and the drain or between the gate and the drain, generation of impact ions or an effect of a channel length modulation becomes remarkable, resulting in a problem that an excellent analog characteristic may not be obtained. The problem may be improved by changing the concentration of the well to mitigate electric field concentration. As described above, when a method of changing the concentration of the well is employed, the characteristics of the semiconductor device may be enhanced without an increase in device area. In addition, for manufacture of the semiconductor device, in a case where an existing semiconductor device is manufactured in another factory, the characteristics of the semiconductor device maybe adjusted to desired characteristics without making a drastic change in layout or device area.

Hereinafter, with reference to FIGS. 3A to 3H, a first embodiment of the present invention is described with an n-type MOS transistor being taken as an example.

Figure 3A:
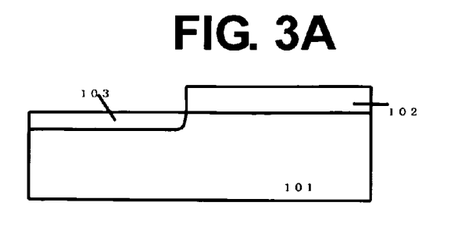
FIGS. 3A to 3H are cross sectional views each illustrating a method of manufacturing an enhancement type MOS transistor and a depletion type MOS transistor according to a first embodiment of the present invention.

In FIG. 3A, in the p-type or n-type silicon substrate 101, impurities are doped into the p-type well region 103 of the depletion type MOS transistor by ion implantation with the use of a photoresist 102.

Figure 3B:
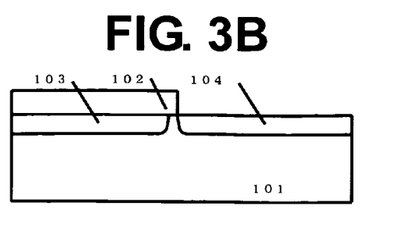

In FIG. 3B, the p-type well region 103 of the depletion type MOS transistor is covered with the photoresist 102, and impurities are doped into the p-type well region 104 of the enhancement type MOS transistor by ion implantation.

Figure 3C:
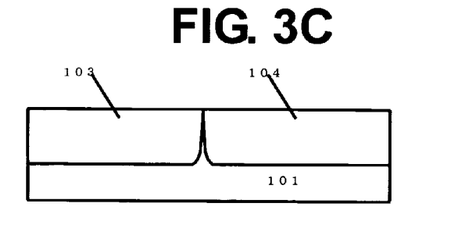

In FIG. 3C, the p-type well region 103 of the depletion type MOS transistor and the p-type well region 104 of the enhancement type MOS transistor are extended by thermal diffusion.

Figure 3D:
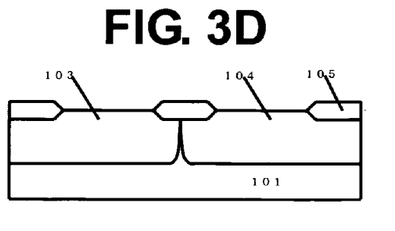

In FIG. 3D, the field insulating film 105 having a film thickness of approximately 100 to 500 nm is formed using a local oxidation of silicon (LOCOS) process.

Figure 3E:
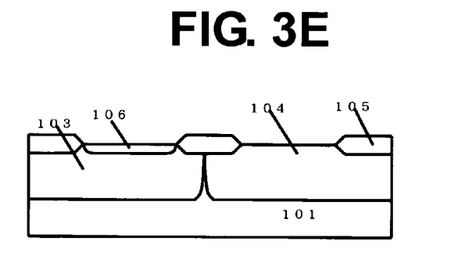

In FIG. 3E, n-type impurities such as arsenic are doped at an amount of approximately $1 \times 10^{12}/cm^2$ by ion implantation, to thereby form the low concentration n-type channel region 106.

Figure 3F:
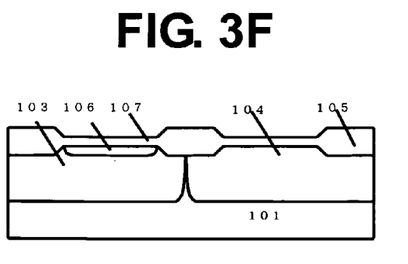

In FIG. 3F, a silicon oxide film having a film thickness of approximately 10 to 100 nm is formed as the gate insulating film 107.

Figure 3G:
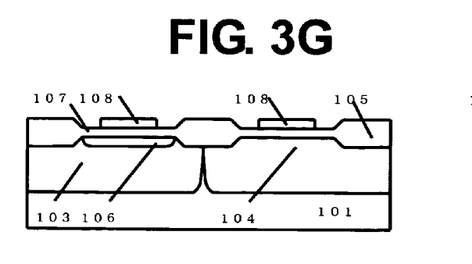

In FIG. 3G, the polycrystalline silicon layer 108 that is to serve as the gate electrode is deposited to a film thickness of approximately 200 to 300 nm and is etched.

Figure 3H:
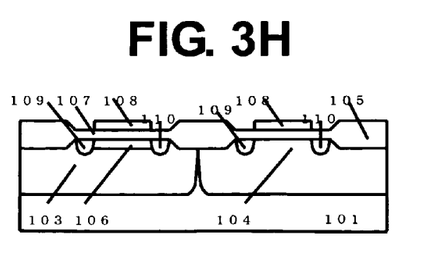

In FIG. 3H, high concentration n-type impurities such as arsenic are doped by ion implantation with the formed gate electrode 108 and the formed field insulating film 105 being used as a mask, to thereby form the source region 109 and the drain region 110. In general, the concentrations of the source region 109 and the drain region 110 are approximately between $5 \times 10^{19}$ cm$^{-3}$ and $1 \times 10^{21}$ cm$^{-3}$. Subsequently, an interlayer insulating film (not shown) is deposited to electrically connect the source region 109 and the drain region 110 to the gate electrode 108.

Figure 4A:
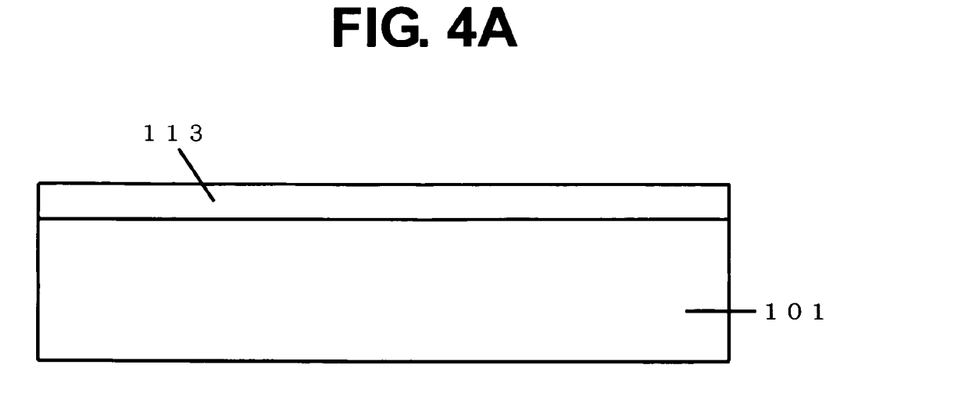
FIGS. 4A to 4C are cross sectional views each illustrating a method of manufacturing an enhancement type MOS transistor and a depletion type MOS transistor according to a second embodiment of the present invention.
Figure 4B:
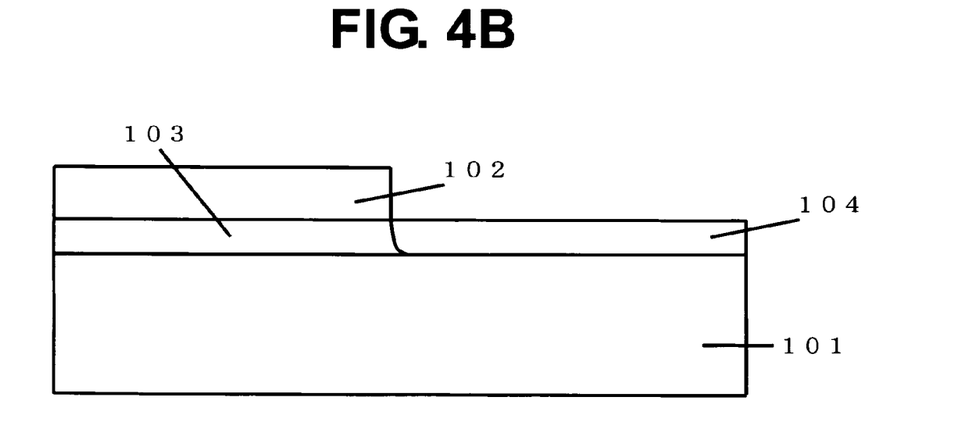
Figure 4C:
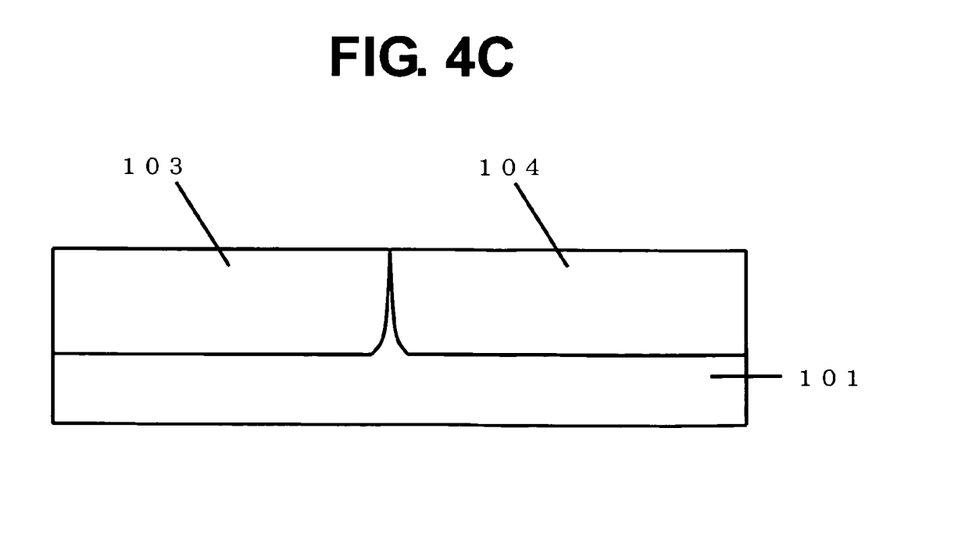

FIGS. 4A to 4C illustrate a second embodiment of the present invention.

In FIG. 4A, in the p-type or n-type silicon substrate 101, impurities are doped into a region 113 that is to become the p-type well region of the depletion type MOS transistor or the enhancement type MOS transistor by ion implantation.

In FIG. 4B, the p-type well region 103 of the depletion type MOS transistor is covered with the photoresist 102, and impurities are doped into the p-type well region 104 of the enhancement type MOS transistor by ion implantation.

In FIG. 4C, the p-type well region 103 of the depletion type MOS transistor and the p-type well region 104 of the enhancement type MOS transistor are changed by thermal diffusion.

Subsequent steps are the same as the steps of the first embodiment described above.

Figure 5:
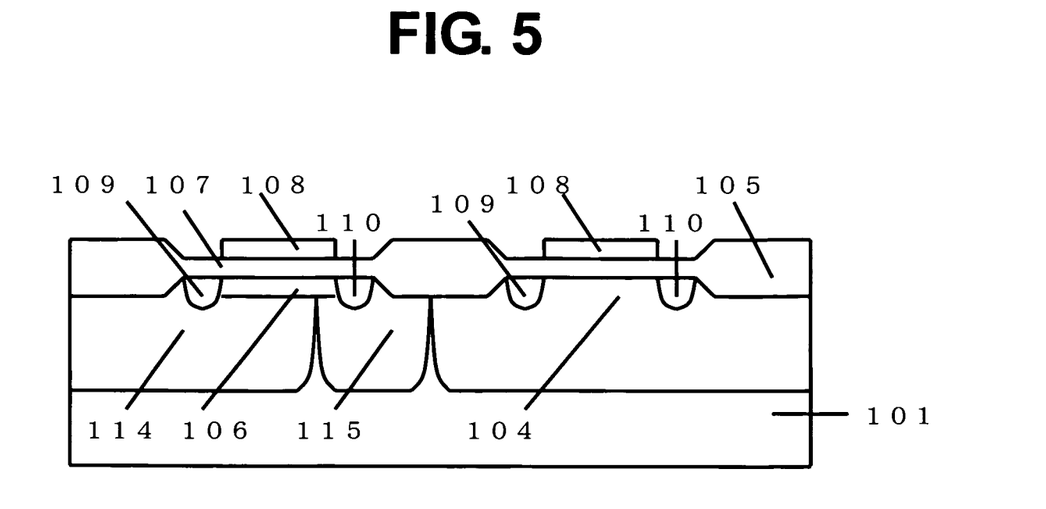
FIG. 5 is a cross sectional view illustrating a case where a part of a well of a depletion type MOS transistor is changed in concentration according to a third embodiment of the present invention.

FIG. 5 illustrates a third embodiment of the present invention. In FIG. 5, a well 115 is formed in a part of the second conductivity type portion of the depletion type MOS transistor. The concentration of the well 115 is different from the concentration of the second conductivity type well 114 of the depletion type MOS transistor. In this case, the concentration of the second conductivity type well 114 of the depletion type MOS transistor may be the same as the concentration of the second conductivity type well 104 of the enhancement type MOS transistor.

Figure 6:
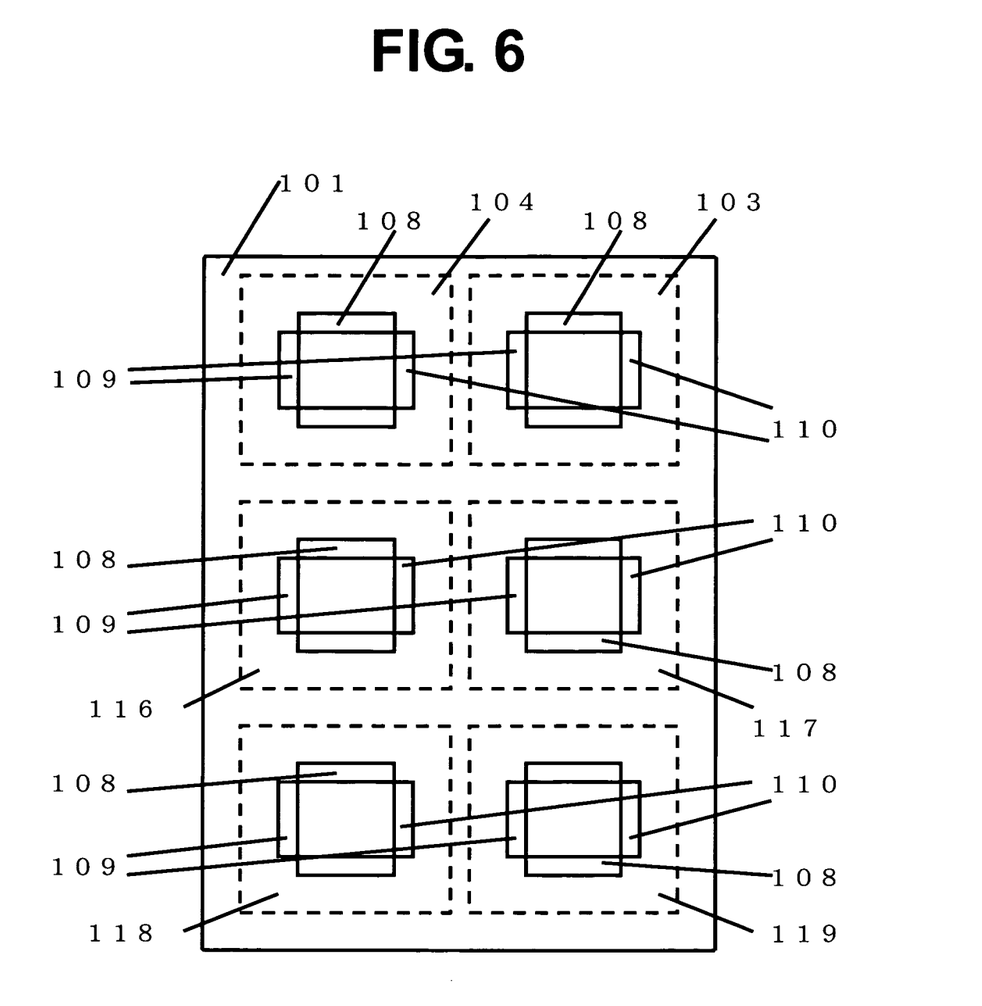
FIG. 6 is a plan view illustrating a case where a plurality of enhancement type MOS transistors and a plurality of depletion type MOS transistors, which are changed in well concentration, are formed according to a fourth embodiment of the present invention.

FIG. 6 illustrates a fourth embodiment of the present invention. In a case where the temperature characteristics need to be accurately adjusted, there are prepared a plurality of enhancement type MOS transistors and a plurality of depletion type MOS transistors which are to serve as a principal circuit of the semiconductor device and which are changed in well concentration (i.e., have different impurity concentrations from one another). An optimum enhancement type MOS transistor and an optimum depletion type MOS transistor are selected by, for example, trimming. As a result, the semiconductor device having desired characteristics may be manufactured.

What is claimed is:

1. A reference voltage generating circuit for a semiconductor device, the reference voltage generating circuit comprising:
    a first well having an impurity concentration;
    an enhancement type MOS transistor formed in the first well;
    a second well having an impurity concentration;
    a depletion type MOS transistor formed in the second well; and
    a third well formed in a portion of the depletion type MOS transistor and having an impurity concentration different from the impurity concentration of the second well.

2. A semiconductor device having the reference voltage generating circuit according to claim 1.

3. A reference voltage generating circuit according to claim 1, wherein the impurity concentration of the first well is the same as the impurity concentration of the second well.

4. A reference voltage generating circuit comprising:
    a first well having an impurity concentration;
    a first MOS transistor formed in the first well;
    a second well having a second impurity concentration;
    a second MOS transistor formed in the second well; and
    a third well formed in a portion of the second MOS transistor and having an impurity concentration different from the impurity concentration of the second well.

5. A semiconductor device having the reference voltage generating circuit according to claim 4.

6. A reference voltage generating circuit according to claim 4, wherein the impurity concentration of the first well is the same as the impurity concentration of the second well.

* * * * *